United States Patent
Gandolfi et al.

(10) Patent No.: US 6,822,592 B2
(45) Date of Patent: Nov. 23, 2004

(54) METHOD FOR SELF-CALIBRATING A FREQUENCY OF A MODULATOR CIRCUIT, AND CIRCUIT USING SAID METHOD

(75) Inventors: Gabriele Gandolfi, Siziano (IT); Vittorio Colonna, Landriano (IT); Andrea Baschirotto, Tortona (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/331,139

(22) Filed: Dec. 27, 2002

(65) Prior Publication Data

US 2003/0146862 A1 Aug. 7, 2003

(30) Foreign Application Priority Data

Dec. 27, 2001 (EP) .............................................. 01830812

(51) Int. Cl.[7] .................................................. H03M 3/00
(52) U.S. Cl. ........................ 341/143; 341/144; 341/145
(58) Field of Search ................................ 341/143, 144, 341/145; 331/44

(56) References Cited

U.S. PATENT DOCUMENTS 3,824,466 A * 7/1974 Olier et al. .................. 375/272
3,992,670 A * 11/1976 Gittins et al. ................ 455/121
5,729,230 A * 3/1998 Jensen et al. ................ 341/143
6,232,901 B1    5/2001 Abbey ......................... 341/143
6,271,781 B1 * 8/2001 Pellon ......................... 341/143
6,414,615 B1 * 7/2002 Cheng ......................... 341/143

* cited by examiner

Primary Examiner—Peguy JeanPierre
(74) Attorney, Agent, or Firm—Lisa K. Jorgenson; Harold H. Bennett, II; Seed IP Law Group PLLC

(57) ABSTRACT

A method for calibrating a frequency of a sigma—delta modulator having a go path that includes, in series, a resonator circuit and of an analog to digital conversion block, and a feedback path including a digital to analog conversion block, including the steps: a) applying an input pulse to the resonator circuit; b) measuring the oscillating frequency of the output signal from the resonator circuit in response to the pulse, while the feedback path of the sigma—delta modulator is opened; c) comparing the oscillating frequency of the resonator circuit with a selected frequency; d) modifying the oscillating frequency proportionately as a function of the comparison step. The resonator circuit includes an integrator filter with a variable gain amplifier in its feedback path, the variable gain configured to be modified as a function of the comparison, performed while the modulator feedback path is opened.

15 Claims, 4 Drawing Sheets

METHOD FOR SELF-CALIBRATING A FREQUENCY OF A MODULATOR CIRCUIT, AND CIRCUIT USING SAID METHOD

FIELD OF THE INVENTION

The present invention relates to a method for self-calibrating a frequency of a modulator circuit, and circuit using said method, particularly but not exclusively a method for self-calibrating a frequency of center band of a band pass sigma-delta type modulator circuit.

BACKGROUND OF THE INVENTION

The sigma-delta modulators, with high performance characteristics, are used in a various number of applications, such as, by way of example, in audio communication systems.

Particularly, said applications require high range dynamic characteristic, for example, by means of a digital resolution of twelve bits, a precise center band frequency, having a value of ten Mhz, a small physical dimension of the modulator and a low current consumption.

Sigma-delta type band passing multi bit modulators are used to reach said performance and physical characteristics.

Referring to FIG. 1, a basic scheme of a sigma—delta modulator is shown, having a loop circuit 1 composed of an adding node 2, a go path 3 and a return path 4, also called feedback path.

In FIG. 1 it is evident that the go path 3 is realized by the series of a first block 5 with a second block 6, wherein said first block 5 is a filtering block and said second block 6 is an analog to digital conversion (ADC) block. The feedback path 4 is, instead, a digital to analog conversion (DAC) block.

The operation of the circuit scheme of FIG. 1 is well known to a skilled person and therefore will not be shown.

In the modulator 1, the filtering block 5, in the easiest implementation, may be made, by way of example, according to an integrator filter scheme of the first order, as shown in FIG. 2, which is well known to an individual skilled in the art.

As shown in FIG. 2, the filtering block 5 is composed by a block 7, having in the feedback path an amplifier 8.

Particularly the block 7 is a discrete filter having as transfer function H(z) the following relationship:

$$H(z)=a_1{}^*z^{-1}/(1-b_1{}^*z^{-1}) \qquad (1)$$

while the amplifier 8 has an opportune amplifying value suitable for the embodiment of the sigma-delta modulator.

Referring now to FIG. 3, an output spectrum from a modulator having, as a filtering block, a filter of the third order is shown, including an abscissa axis indicating the frequency evaluated in MHz, and an ordinate axis indicating the output noise spectrum evaluated in dB, a first graph 9, a second graph 10 and an observation band 12.

The first graph 9 is the ideal output spectrum of a third order modulator in the case of a pulsed input, in which the modulator has ideal characteristics.

In fact, inside of such a band 12, for example the band of FM signals, it is possible to note the presence of three minimum points 11, which represent the three notch frequencies introduced by each of the three discrete filters included in the go path of the loop of the modulator.

The second graph 10 is, instead, the actual output spectrum from the same third order modulator in the case of a pulsed input when the phase errors and gain errors introduced by the devices or by the process spreads introduce a sort of shifting of the ideal output spectrum 9 to the actual output spectrum 10.

It is just this shifting that produces the biggest problems of centering of the frequency.

As can be deduced from FIG. 3, when the integration operation is performed, an extra energy 13 is integrated, that is present over a selected threshold level 14.

Level 14 is the thermal noise level, always present in the modulator, and the extra energy 13 is therefore that part of energy that is integrated unnecessarily, degrading the dynamic range.

A structure as heretofore described with reference to FIG. 2, has problems caused by the non ideality of the integrator filter 7, which introduce phase errors and gain errors, depicted respectively by the coefficient $b_1$ and by the coefficient $a_1$ in the previous relationship (1), and gain and finite gain band product problems of the amplifier 8.

Various solutions have been proposed to solve such problems, among which are techniques based on the master-slave concept, wherein there is a duplication of the circuitry so as to calibrate the first circuit in function of the errors of the second circuit, and compensating circuit techniques of the finite gain effects.

However no technique has been able to prevent the previous listed factors from causing a shifting of the center frequency of the modulator 1 or an integration of undesired energy. Therefore, the problem remains of centering the center band frequency in the most precise possible way, without a degrading of the dynamic range.

BRIEF SUMMARY OF THE INVENTION

According to an embodiment of the present invention, a method is provided, for calibrating a frequency of a sigma-delta modulator, said sigma-delta modulator having a go path and a feedback path, said go path including, in series, a resonator circuit and of an analog to digital conversion ADC block, said feedback path including a digital to analog conversion DAC block, said method comprising: a) applying an input pulse to said resonator circuit while the feedback path of said sigma-delta modulator is opened; b) measuring the oscillating frequency of the output signal from said resonator circuit in response to said pulse; c) comparing said oscillating frequency of said resonator circuit with a frequency known a priori; d) modifying said oscillating frequency of said resonator circuit proportionately, as a function of said comparing step (c).

According to another embodiment of the invention, a circuit for calibrating a frequency is provided, comprising a go path, including, in series, a resonator circuit and an analog to digital conversion ADC block, said resonator circuit comprising an integrator filter having, on its own feedback path, a variable gain amplifier. The frequency calibrating circuit further includes a circuit feedback path having a digital to analog conversion DAC block. Said variable gain of said amplifier is configured to be modified in a proportional way as a function of a comparison between an output signal frequency present at an output of said resonator circuit as a response to a pulsed signal present at an input thereof, and a frequency known a priori, while said circuit feedback path is opened.

Thanks to the present invention it is possible to make a measurement of a frequency within a shortened observation period, as compared to known methods and devices.

BRIEF DESCRIPTION OF THE SEVERAL VIEWS OF THE DRAWINGS

The features and the advantages of the present invention will be made evident by the following detailed description of an embodiment thereof which is illustrated as not limiting example in the annexed drawings, wherein.

DETAILED DESCRIPTION OF THE INVENTION

Figure 1:
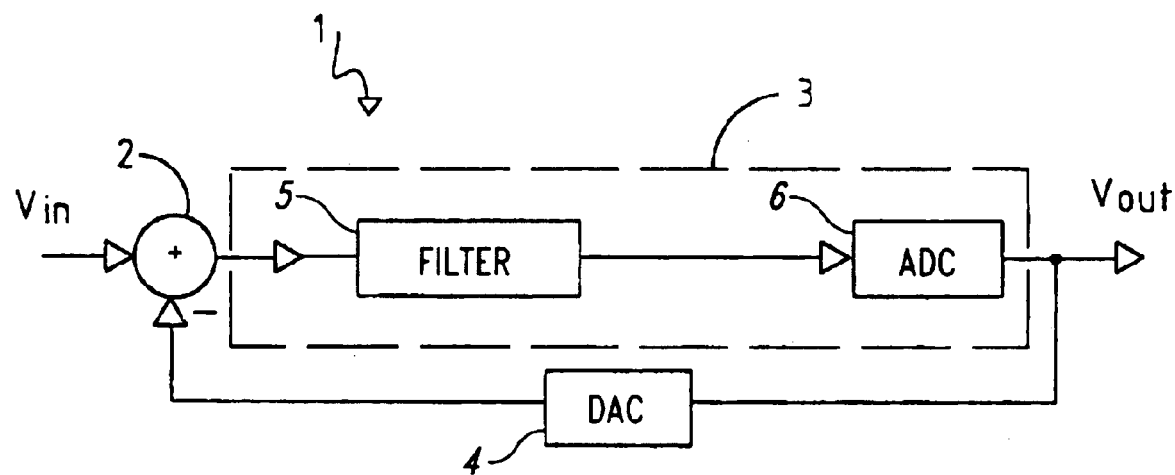
FIG. 1 shows a basic scheme of a sigma-delta modulator, according to the prior art.
Figure 2:
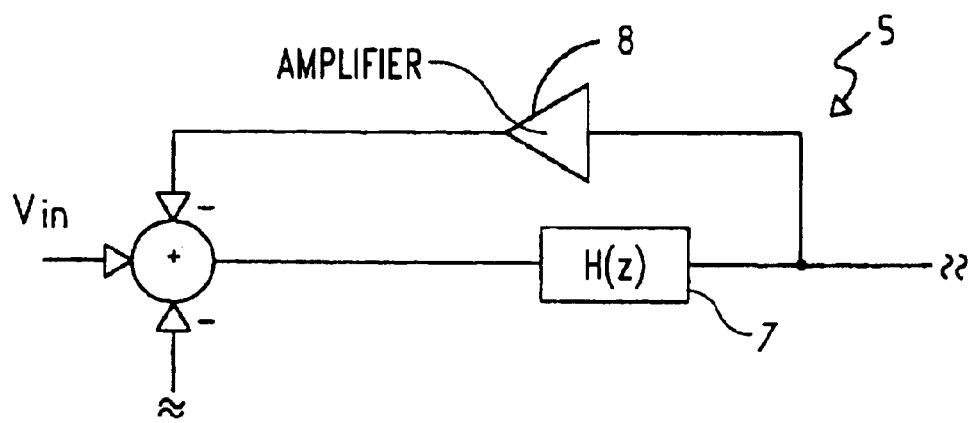
FIG. 2 shows in detail a device of the FIG. 1.
Figure 3:
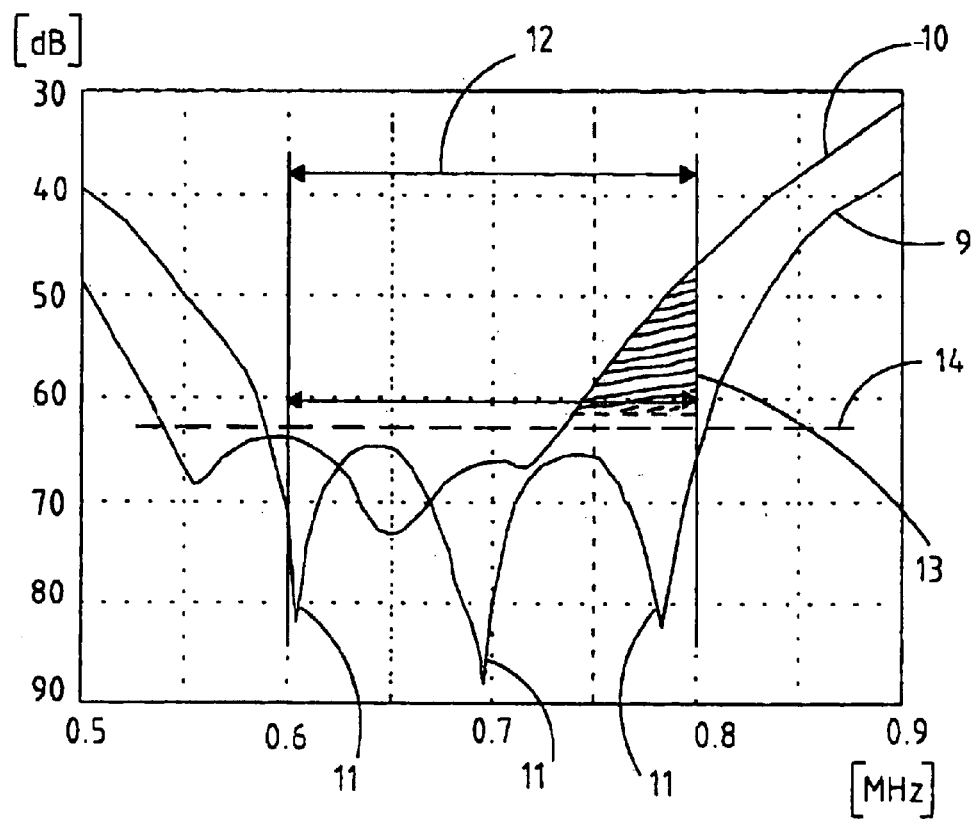
FIG. 3 shows an output spectrum from a sigma-delta modulator of third order, according to the prior art.
Figure 4:
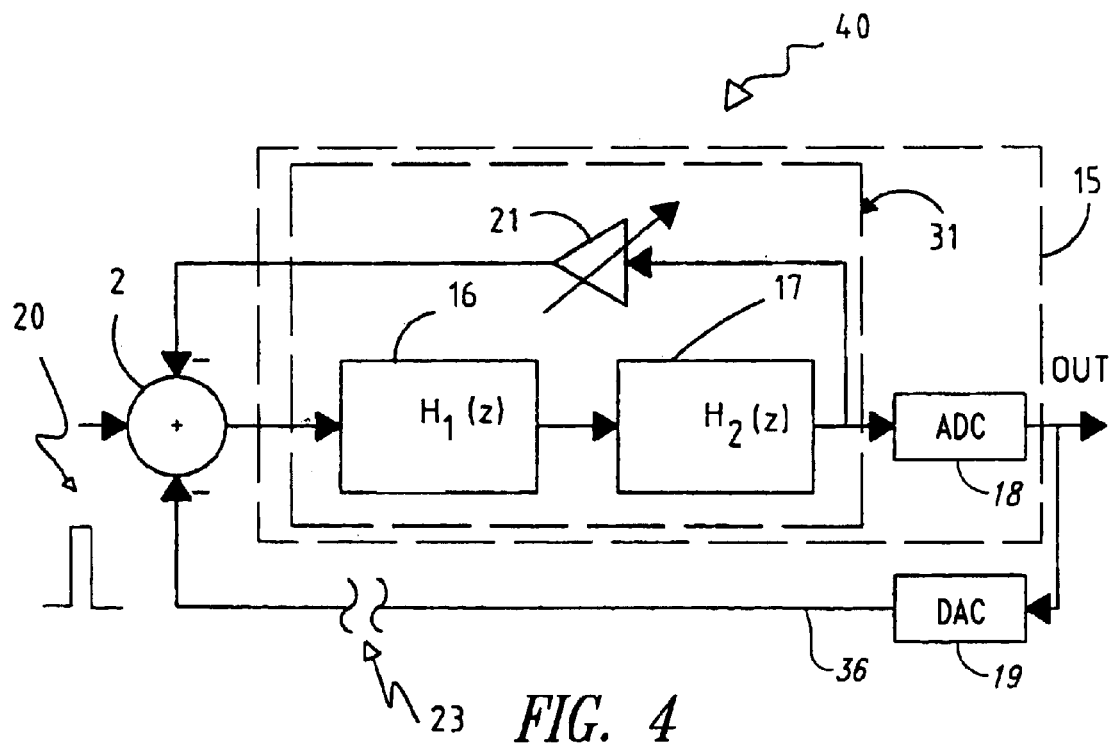
FIG. 4 shows a configuration of a sigma-delta modulator, according to the present invention.

In FIG. 4 a sigma-delta modulator 40 of the second order is shown, wherein the go path 15 includes, in series, a resonator circuit 31 and an analog to digital conversion ADC block 18.

Said resonator circuit 31 is made by a first block 16 having in series a second block 17, wherein said first 15 and second 16 blocks are filtering blocks having as transfer function a function equal to that shown in the relationship (1), and more precisely:

$$H_1(z) = a_1 * z^{-1}/(1 - b_1 * z^{-1}) \quad (2)$$

$$H_2(z) = a_2 * z^{-1}/(1 - b_2 * z^{-1}) \quad (3)$$

In feedback with said two blocks 16 and 17 there is an amplifier 21 having a gain variable "g" as a function of parameters that will described later.

Next is an analog to digital conversion block ADC 18, and in the feedback path 36 there is a digital to analog conversion block DAC 19.

It is to be noted that the loop on the feedback path 36 is open at point 23, which allows analysis of the oscillating frequency of the resonator block 31 without the feedback of the DAC block 19.

By applying a pulse 20 to the input IN of the adding node 2 while the feedback path 36 is open, the series made by the two filtering blocks 16 and 17 provides an output signal that assumes a shape of a damped sinusoid, as shown in the FIGS. 5 and 6, hereinafter described.

In order to obtain the pulse response of the two blocks 16 and 17 a zeta transform is used, so as to obtain an output signal having a relationship (for a detailed mathematic analysis refer to "Analog Mos Integrated Circuits for Signal Processing", ROUBIK GREGORIAN and GABOR C. TEMES, ed WILEY) of the following type:

$$y(n*T) = K * a_1 * a_2 * k^{n*T_s} * \sin(2*n*\pi*f_0*T_s)/[k^T * \sin(\omega_0 * T_s)] \quad (4)$$

where k depends on the phase error of the two blocks 16 and 17, whilst $\omega_0$ depends on the amplifying coefficient "g" of the amplifier 21, $T_s$ is the sampling frequency and $f_0$ is the center band frequency of the two filters $H_1(z)$ and $H_2(z)$.

The frequency $f_0$ is the center band frequency of the sigma-delta band passing modulator 40 that is known a priori.

By way of example, the amplifying coefficient "g" is achieved by means of a capacitor array, an example of which will be described later with reference to FIG. 7 (not shown in FIG. 4), wherein each one of the capacitors is connectable or disconnectable in parallel under specific conditions.

In this way it is possible to form a variable value of the amplifying coefficient "g", by making a discrete type control of said amplifying value "g".

The relationship (4) shows that the damped sinusoid, generated due to application of the pulse 20, is correlated with the center band frequency $f_0$ of the sigma-delta band passing modulator 40.

It is this frequency $f_0$ that must be maintained as precisely as possible around its nominal value to avoid dynamic degrading. The present invention allows measurement and eventual correction of the frequency $f_0$.

Figure 5:
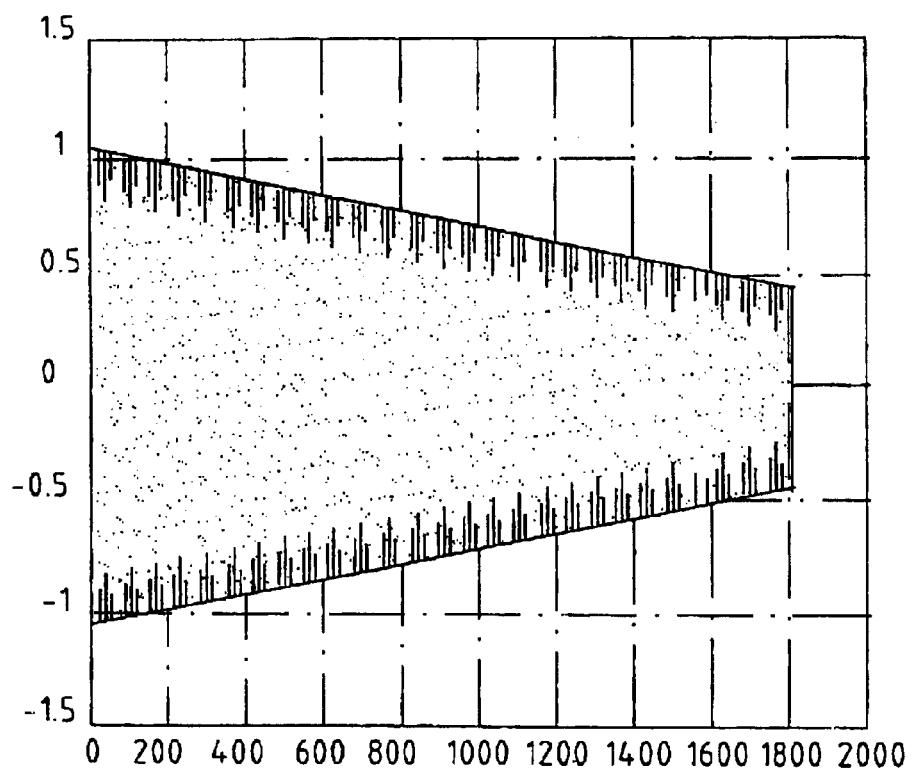
FIG. 5 shows a graph of the response to a pulse of the sigma-delta modulator shown in FIG. 4.
Figure 6:
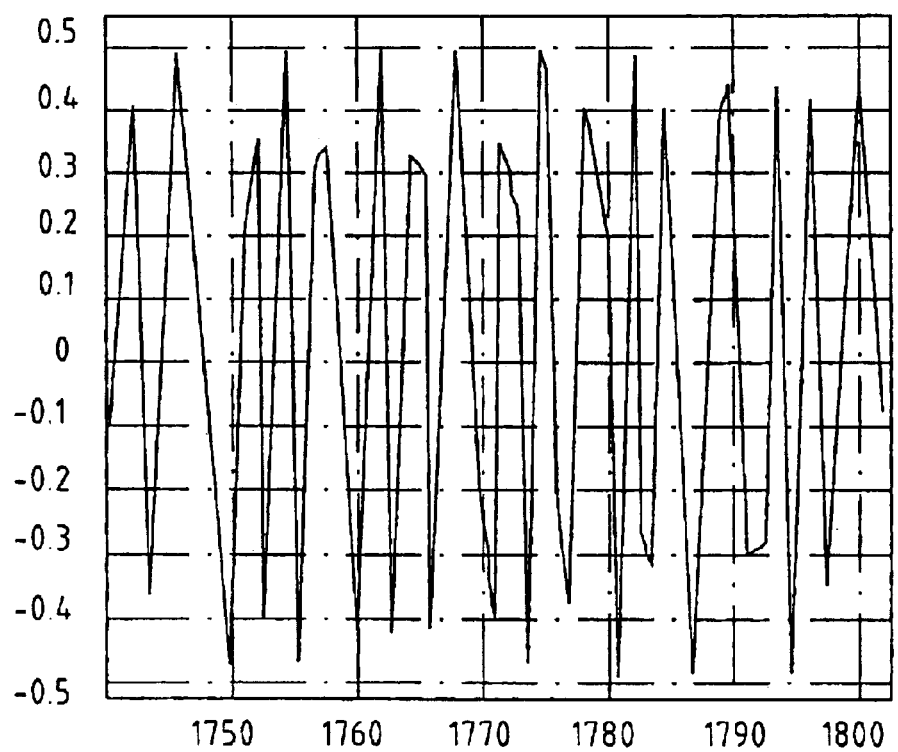
FIG. 6 shows a portion of the graph of FIG. 5 in detail.

In FIG. 5 the graph of the pulse response 20 of the resonator circuit 31 described in FIG. 4 is shown, while in FIG. 6 a detail portion of the graph of FIG. 5 is shown.

In particular, FIG. 5 shows an abscissa axis showing the number of samples, and an ordinate axis showing the width of said samples.

FIG. 6 has the same axes showing the same quantities, with the characteristic of magnifying a range of samples, particularly the range of samples 1750–1800.

From the two FIGS. 5 and 6, it is possible to deduce that the pulse response of the go path 15 of the modulator 40 of FIG. 4 in a condition of open loop is equal to a damped sinusoid, the trend of which is to flatten on the abscissa axis over an infinite observation time.

In order to measure and eventually to correct the center band frequency $f_0$, first the feedback loop 36 is opened and a pulse 20 is injected into the input IN. Due to this injection the resonator block 31 made by, for example, the switched capacitor filters $H_1(z)$ and $H_2(z)$, provides, as response to the pulse 20, a damped sinusoid having a formula as the relationship (4). Successively, the oscillating frequency of said damped sinusoid (4) is measured, that is the crossings of the abscissa axis are counted in a prefixed period or observation period (or time). Finally, in function of the measured oscillating frequency or similarly the number of crossings of the abscissa axis, the value "g" of the amplifier 21 placed in feedback to the filters $H_1(z)$ 16 and $H_2(z)$ 17 is modified until the oscillating frequency of said damped sinusoid reaches the center band frequency $f_0$.

The method thus described can be repeated until there is a perfect convergence between the oscillating frequency of the resonator circuit 31 and of the center band $f_0$ of the sigma-delta band passing modulator 40.

The present invention analyzes the oscillating frequency and corrects the difference between said measured oscillating frequency and the center band frequency $f_0$, by adjusting the amplifying value "g" of the amplifier 21.

This is possible because the number of crossings of the abscissa axis of the damped sinusoid is proportional to the center band frequency $f_0$.

To measure the crossings of the abscissa axis in a given period of time, that is to measure the oscillating frequency of the damped sinusoid described by the relationship (4), one of the comparators (not shown in FIG. 4) present inside the ADC block 18 is used.

In other words, according to the present invention, a computation of the crossings for the abscissa axis of the damped sinusoid is performed, via one of the comparators present inside the ADC block 18, a comparison between said number of counter and a number known a priori is then performed, showing the number of crossings that should have occurred, by taking into account the center band frequency $f_0$ as reference value and once said comparison is made, the amplifying value "g" of the amplifier 21 is modified by connecting or disconnecting capacitors in parallel, so as to converge to the ideal number of crossings represented by the center band frequency $f_0$.

Finally the amplifying value "g" is modified by converging the number of the crossings of the damped sinusoid to a desired threshold, represented by the center band frequency $f_0$.

The time period, during which the observation of the crossings for the abscissa axis by the damped sinusoid is performed, determines the precision of the counting of the number of crossings. The longer the time period the greater is the accuracy of the measurement.

By way of example, assuming that $T_s$ is the sampling period, $T_0$ is the oscillating period and $T_2$ is the window or time period of observation, the number N of crossings for the abscissa axis (either the crossing is made with positive or negative slope) is:

$$N = T_w / T_0 \quad (5)$$

This number N of crossings is implemented, according to the present invention, in the digital domain, causing a better efficiency with respect to those systems used in the prior art.

Referring again to the relationship (5) heretofore described, it is to be noted that the observation time $T_w$ depends particularly on the most stringent of two minimum times, that are: 1st) minimum time required to obtain the desired resolution, that is the number of crossing, or oscillating frequency; 2nd) minimum time required to reduce the error of the number N with respect to the desired threshold of crossings.

The minimum time required to obtain the desired resolution is due to the intrinsic nature of the measure type and therefore said time limit afflicts every detecting system type, including systems that use circuitry working in the analog domain, while the second minimum time required to reduce the error of the number N with respect to the desired threshold of crossings depends only on the nature of the sampled data, that is on the structure of the inventive method.

The minimum time required for the detecting of the oscillating frequency is limited by the precision that is to be adopted and it is given by the following relationships:

$$f_0 = 1/T_w \quad (6)$$

$$T_w = 1/\Delta f_0 \quad (7)$$

This states that to solve the problem of the convergence to the center band frequency or notch $f_0$ with a resolution frequency $\Delta f_0$, the measure window time must be in accordance with relationship (7).

If, for example, a resolution of $\Delta f_0 < 20$ Khz is desired and taking into account the crossings of the abscissa axis with the positive slope, the measure window must be greater or equal to:

$$T_w \geq 1/\Delta f_0 \geq 50 \, \mu sec \quad (8)$$

and in function of said relationship (8), taking into account as sigma-delta modulator a modulator having the characteristics of a clock or system frequency $f_{clock} = 37.05$ Mhz, of a center band or notch frequency $f_0 = 10.7$ Mhz and a resolution frequency $\Delta f_0 = 20$ Khz, it may be deduced that the number samples for obtaining the desired resolution has to be equal to:

$$N = T_w * f_{clock} = 50 \mu * 37.05 M = 1800 \quad (9)$$

For the minimum time required to reduce the error of the number N of samples with respect to the desired threshold of crossings, since the inventive system works with sampled data, the working time is made discrete while the observation window is not so, and therefore when the number N of crossings of the abscissa axis is evaluated an error is committed that must be contained inside the desired resolution.

In other word there is an intrinsic inaccuracy due to the sampling methodology so that there is a difference between the number N of crossings and the sampling period $T_s$.

Therefore, if, for example, a resolution frequency better than $\Delta f_0 = 20$ Khz is desired, that is a resolution around the center band frequency $f_0$ greater than, for example, 0.2%, which is 20 KHz/10.7 MHz=0.2%, the maximum tolerated error is deduced by the following relationship:

$$N_r = (T_w - T_s)/T_0 \quad (10)$$

where $N_r$ is the real number of the crossings for the abscissa axis, $T_w$ the period of the observation window, $T_s$ the sampling period and $T_0$ the inverse center band frequency or the inverse notch frequency $f_0$.

By combining the relationship (5) with the relationship (10) the maximum tolerated error is exactly:

$$\text{Err} = (N - N_r)/N = T_s/T_w \quad (11)$$

For example, if a sigma-delta modulator is again considered having such characteristics: a clock or system frequency $f_{clock} = 37.05$ Mhz, of a center band or notch frequency $f_0 = 10.7$ Mhz and a resolution frequency $\Delta f_0 = 20$ Khz, that is an error equal to Err=20 KHz/10.7 MHz=0.2%. By putting a more stringent limit, as for example 0.1%, the time period of the window may be determined from the relationship (11) to be equal to:

$$T_w \geq T_s * 0.1\% \geq 26 \mu \quad (12)$$

By comparing the limitation imposed by relationship (12), which is the limitation imposed by the inventive method, in which $T_w$ is greater or equal to 26 $\mu$sec, with the relationship (8), which is the limitation imposed by any measure system, wherein the observation time $T_w$ must be greater or equal to 50 μsec, it may be seen that the limitation imposed to the observation window by the inventive method is half that forced by the relationship (8), while achieving twice the accuracy.

Figure 7:
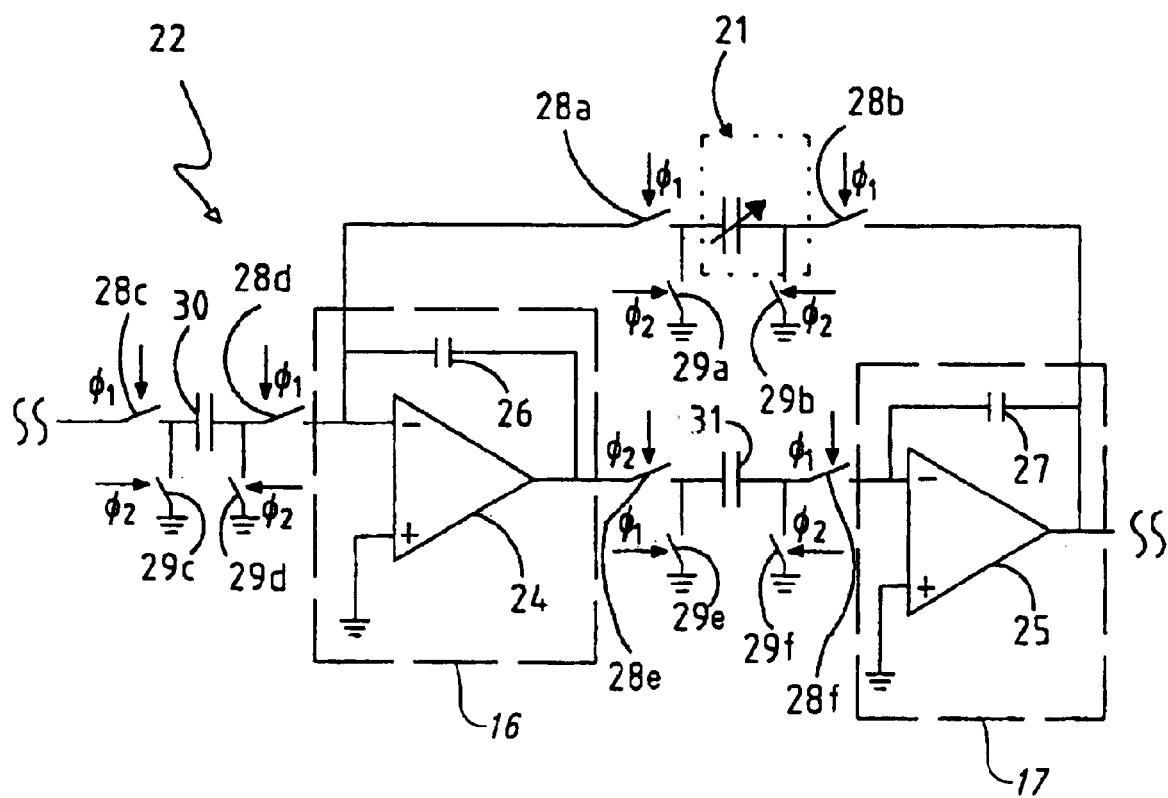
FIG. 7 shows a circuit embodiment of the present invention.

A possible embodiment of a circuit 22 adapted to realize the present invention is shown in FIG. 7, wherein a switched capacitor circuit is described.

In particular, the circuit 22 is an implementation of the block 31 of FIG. 4.

The series of the two integrator filters 16 and 17 and of the amplifier 21 of variable gain "g" should be especially noted.

Particularly, the integrator filters 16 and 17 are realized by using respective inverting amplifiers 24 and 25, having as feedback devices respective capacitors 26 and 27, whereas the amplifier 21 of variable gain "g" is realized by means of a capacitor array, the implementation of which is well known to one skilled in the art, and it is programmable as a function of programming signals $\phi_1$ and $\phi_2$ adapted to switch the working state ON/OFF of respective switches 28a, 28b and 29a and 29b.

In said FIG. 7 other circuit elements are also shown, such as an input capacitor 30 and a decoupling capacitor 31 between said two integrator filters 16 and 17.

Both the capacitors 30 and 31 are programmable in function of said programming signals $\phi_1$ and $\phi_2$ adapted to switch the state of respective switches.

Particularly the signals $\phi_1$ and $\phi_2$ program for the input capacitor 30 respectively the switches 28c, 28d and 29c and 29d, whilst for the decoupling capacitor 31 they program respectively the switches 28e, 28f and 29e and 29f.

Once by means of the inventive method the number of crossings of the abscissa axis is evaluated, and once said number is compared with the nominal value known a priori, the eventual difference is used to calibrate the transfer function of the two integrator filters 16 and 17. In particular, the control is realized, as heretofore described, by means of the amplifying value "g" of the amplifier 21.

A substantially self-calibrating or an automatic tuning operation of the resonator circuit 31 and therefore of the modulator 40 as a function of the result of the comparison between the oscillating frequency and the center band frequency $f_0$ is achieved.

In such a way, it is possible to change in a proportional way the value of the oscillating frequency as a function of the amplifying value "g" according to the following relationship:

$$f_0 = f_s * (g * a_1 * a_2 - b_1 - b_2)/-2*r \qquad (13)$$

where $f_s$ is the sampling frequency, $a_1$, $b_1$, $a_2$ and $b_2$ are the errors introduced by the integrator filters 16 and 17 and "r" is the radius of the position of the poles in the "z" plane.

For example, with the numerical values previously introduced, the control of the amplifying value "g" is discrete and in order to obtain a resolution frequency $\Delta f_0 = 20$ Khz every capacitor connectable in parallel must have a value of 21 fF such that the oscillating frequency changes by a step of 20 KHz.

By assuming, for example, that the number of crossings calculated inside the observation window $T_w$ is equal to the number $N_1$ and the number of crossings known a priori is $N_2$ and due to the comparison between $N_1$ and $N_2$ there is a positive number, then the combination of the signals $\phi_1$ and $\phi_2$ for the amplifier 21 provides that the amplifying factor "g" is modified by means of the connection of as many capacitors as shown in said comparison, while if the comparison between $N_1$ and $N_2$ produces a negative number, the combination of the signals $\phi_1$ and $\phi_2$ for the amplifier 21 provides that the amplifying factor "g" is modified by means of the disconnection of as many capacitors as shown in said comparison.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. Method for calibrating a frequency of a sigma—delta modulator, said sigma—delta modulator having a go path and a feedback path, said go path including, in series, a resonator circuit and an analog to digital conversion block, said feedback path including a digital to analog conversion block, said method comprising:
    a) applying an input pulse to said resonator circuit while the feedback path of said sigma—delta modulator is opened;
    b) measuring an oscillating frequency of an output signal from said resonator circuit in response to said pulse;
    c) comparing said oscillating frequency of said resonator circuit with a frequency known a priori;
    d) modifying said oscillating frequency of said resonator circuit proportionately, as a function of said comparing step.

2. Method according to the claim 1, wherein said steps (a)–(d) are iterated until said oscillating frequency of said resonator circuit converges with said frequency known a priori.

3. Method according to the claim 1, wherein said step (b) is performed by means of a counting operation of the crossings of an abscissa axis by said output signal from said resonator circuit in a selected time period.

4. Method according to the claim 1, wherein said step (d) is performed by discrete modification of an amplifying gain of said resonator circuit.

5. Method according to the claim 4, wherein said resonator circuit includes an integrator filter having in feedback an amplifier with said amplifying gain.

6. Method according to claim 5, wherein said amplifying gain of said amplifier is achieved by means of a plurality of capacitors placed in parallel and connectable as a function of said comparison performed at the step (c) of the claim 1 by means of a plurality of controlling signals adapted to control respective switches.

7. Method according to claim 5, wherein said amplifying gain of said amplifier is achieved by means of a plurality of capacitors placed in parallel and disconnectable as a function of said comparison performed at the step (c) of the claim 1 by means of a plurality of command signals adapted to control respective switches.

8. Method according to claim 1 wherein said step (d) is performed by the following relationship:

$$f_o = f_s * (g * a_1 * a_2 - b_1 - b_2)/-2 * r$$

where "$f_s$" is the oscillating frequency of the output signal from said resonator circuit, "$a_1$, $b_1$, $a_2$" and "$b_2$" are errors introduced by the integrator filter, "r" is the radius of the position of the poles in the "z" plane and "g" is said amplifying gain.

9. Circuit for calibrating a frequency, comprising:
a go path, including, in series, a resonator circuit and an analog to digital conversion block, said resonator circuit comprising an integrator filter having on its feedback path a variable gain amplifier; and
a circuit feedback path including a digital to analog conversion block;
wherein said variable gain of said amplifier is configured to be modified in a proportional way as a function of a comparison between an output signal frequency present at an output of said resonator circuit as a response to a pulsed signal present at an input thereof and a frequency known a priori, while said circuit feedback path is opened.

10. Circuit according to the claim 9, wherein said integrator filter includes an inverting amplifier having in feedback a prefixed value capacitor and said variable gain of an amplifier, said inverting amplifier having its positive input terminal connected at ground and its negative input terminal connected to an input capacitor, said input capacitor controlled by a plurality of controlling signals adapted to control respective switches.

11. Circuit according to claim 10, wherein said amplifying gain of said amplifier is achieved by means of a plurality of capacitors placed in parallel and connectable as a function of said comparison by means of the plurality of controlling signals adapted to control respective switches.

12. Circuit according to claim 10, wherein said amplifying gain of said amplifier is achieved by means of a plurality of capacitors placed in parallel and disconnectable as a function of said comparison by means of the plurality of controlling signals adapted to control respective switches.

13. A method, comprising:
opening a feedback path of a sigma-delta modulator;
applying a pulsed signal to an input of a resonant circuit in a go path of the modulator;
comparing an output frequency of the resonant circuit with a selected frequency;
adjusting a gain of an amplifier in a feedback circuit of the resonant circuit as a function of a difference between the output frequency and the selected frequency.

14. The method of claim 13 wherein the steps of claim 14 are repeated until the output frequency is equal to the selected frequency, within a selected tolerance.

15. The method of claim 13 wherein the modifying step is performed by adjusting capacitances in the feedback circuit of the resonant circuit.

* * * * *